United States Patent [19]

Reindel et al.

[11] Patent Number: 4,598,253

[45] Date of Patent: Jul. 1, 1986

[54] JFET OHMIC DIFFERENTIAL AMPLIFIER

[75] Inventors: Kenneth A. Reindel, Broadview Hts.; Thomas J. Mego, Brecksville, both of Ohio

[73] Assignee: Keithley Instruments, Inc., Cleveland, Ohio

[21] Appl. No.: 651,231

[22] Filed: Sep. 17, 1984

[51] Int. Cl.[4] .............................................. H03F 3/45
[52] U.S. Cl. ....................................... 330/253; 330/261
[58] Field of Search ................ 330/252, 253, 261, 277

[56] References Cited

FOREIGN PATENT DOCUMENTS 0047904 4/1979 Japan ................................... 330/253

Primary Examiner—James B. Mullins
Assistant Examiner—G. Wan
Attorney, Agent, or Firm—Yount & Tarolli

[57] ABSTRACT

The JFET transistor differential amplifier herein serves as an input stage, as for an electrometer operational amplifier, and exhibits high input impedance and low leakage current. This is achieved by biasing the JFET transistors so as to operate in the ohmic region rather than the saturation region of their characteristic drain current-gate to source voltage curve.

5 Claims, 10 Drawing Figures

JFET OHMIC DIFFERENTIAL AMPLIFIER

BACKGROUND OF THE INVENTION

This invention relates to the art of differential amplifiers and more particularly to such an amplifier employing JFET transistors operating in the ohmic region.

The differential amplifier will be described herein as being in the input stage of an electrometer; although, it is to be appreciated that the invention may be applied to other applications requiring an amplifier exhibiting high input impedance, for measuring voltage, and low input bias current, or leakage current for measuring current.

Differential amplifiers are frequently employed in applications for measuring voltage and current, and in such applications are used in the input stage of an electrometer. Electrometers are known in the art, and typically serve to measure primarily DC voltage and current, although many also include extensions of these parameters, such as resistance or charge measurement. For measuring voltage, a distinguishing feature of the instrument is a very high input resistance, typically on the order of $10^{13}$ to $10^{15}$ ohms. This is important when measuring voltages from sources having high series resistance which would be loaded excessively by normal digital voltmeters (DVM). As an example, measurement of electrochemical EMF or pH requires high input resistance.

When an electrometer is employed for measuring current, it should exhibit very low input bias current (leakage current) since the current resolution of an electrometer picoammeter may well be in the range of fA ($10^{-15}$A) or aA ($10^{-18}$A). A typical application of an electrometer picoammeter is the measurement of a very high resistance on the order of $10^{12}$ to $10^{16}$ ohms by impressing a voltage across the resistance in series with the picoammeter.

In order to achieve an input stage for an electrometer having the characteristics of high input impedance and low leakage, it has heretofore been common practice to employ an input stage comprised of MOSFET transistors. The MOSFET transistors are acting as an input stage to a differential amplifier, sometimes referred to as an operational amplifer or OP-AMP. An example of such a MOSFET OP-AMP input stage for an electrometer is found in the U.S. Pat. No. to Shah, 3,654,468. Such an input stage has exhibited the desirable high input impedance and low leakage (or input bias) current required of an electrometer. However, the high input impedance achieved with a MOSFET transistor is primarily dependent on the insulating properties of a thin silicon dioxide layer, sometimes referred to as the gate insulation layer. While such a circuit exhibits the desired low input bias current characteristic, it does exhibit poor overload characteristics unless suitable protection circuitry is provided. Thus, input voltage transients on the order of 30 volts or more may cause breakdown or puncture of the gate insulation layer. Additionally, such MOSFETs frequently require careful offset, temperature compensation, common mode rejection, noise and bias current selection which may be batch sensitive with low yields.

It has been known in the past to employ JFETS instead of MOSFETs as the input stage for an electrometer. Such JFETs are connected in a differential amplifier and have exhibited improved voltage characteristics as compared with those of MOSFETs, but typically have higher input bias current by a factor of 10, for example. Thus, a MOSFET input stage is known to exhibit a low input bias current on the order of less than 5 fA ($5 \times 10^{-15}$A). On the other hand, a known JFET input stage, while exhibiting excellent voltage characteristics, may have input bias current which is on the order of 60 fA. It is important that the electrometer have an input bias current which is substantially less than the input current to be measured. Such a large input bias current of known JFETs severely limits the applications to which an electrometer employing such a JFET input stage may be applied.

SUMMARY OF THE INVENTION

It is therefore a primary object of the present invention to provide a JFET input stage for use, as with an electrometer, wherein the input stage exhibits high input impedance and low leakage comparable to that of prior art MOSFET input stages, but without requiring the use of complex voltage protective circuitry required of such MOSFET input stages.

It is a still further object of the present invention to provide such an input stage employing a JFET differential amplifier having voltage characteristics approaching those of the prior art JFET source follower circuits with an input bias current approaching that of prior art MOSFET input stages.

It is a still further object of the present invention to provide such an input stage employing JFETS which are biased for operation in such a manner to reduce gate-channel leakage and operate essentially as voltage controlled resistors rather than current sources as in the case of prior art JFET source followers and, hence, provide high immunity to damage from overload and electrostatic discharge as well as low voltage noise and low offset drift, while at the same time optimizing the input bias current.

The foregoing and other objects of the invention are obtained in accordance with the present invention with an input stage employing a pair of JFETs connected as a differential amplifier and providing biasing circuitry for maintaining the drain to source voltage ($V_{DS}$) on a level below that of $V_{GS}$-$V_{GS\ OFF}$ to thereby reduce $V_{DG}$ and $V_{GS}$ which thereby reduces gate-channel leakage. In this manner, the differentially connected JFETs operate in the ohmic region rather than the saturation region of their characteristic drain current-gate to source voltage curve. The JFETs operate as voltage controlled resistors rather than current sources with the resistance being dependent upon the gate to source voltage ($V_{GS}$).

DESCRIPTION OF THE DRAWINGS

The foregoing and other objects and advantages of the invention will become more readily apparent from the following description of the preferred embodiment as taken in conjunction with the accompanying drawings which are a part hereof and wherein.

DESCRIPTION OF THE PREFERRED EMBODIMENT

Figure 1:
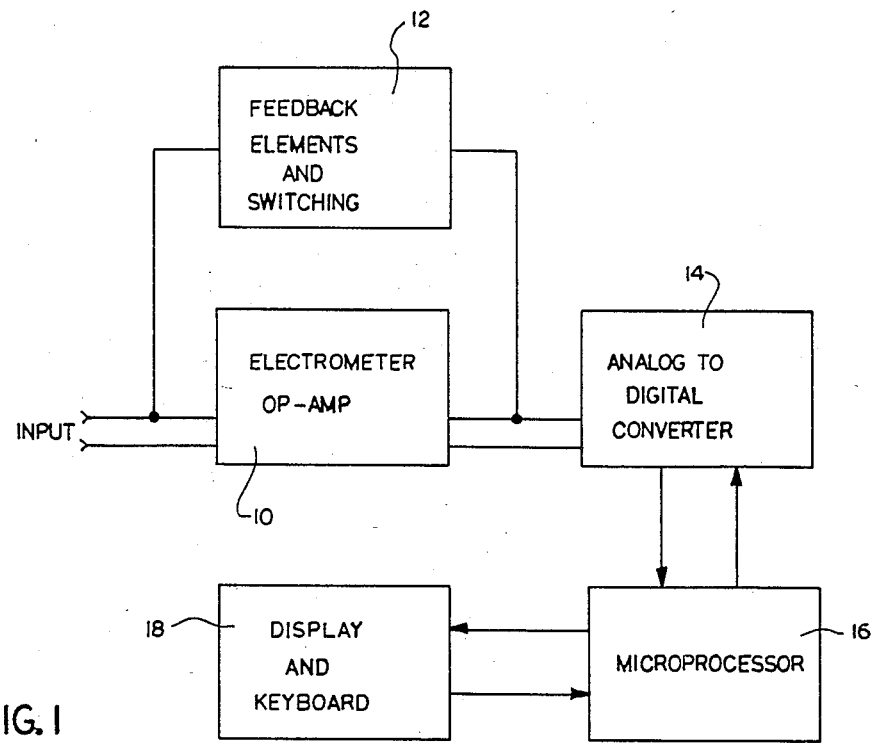
FIG. 1 is a block diagram illustration of an electrometer to which the present invention may be applied.

Reference is now made to the drawings wherein the showings are for the purpose of illustrating a preferred embodiment only and not for limiting same. FIG. 1 illustrates a block diagram of the components employed in an electrometer of the type to which the present invention is applied. This includes an electrometer operational amplifier or OP-AMP 10 for receiving an input from the circuit under test and having an output which takes the form of a voltage representative of either current (when used as an ammeter) or voltage (when used as a voltmeter). Suitable feedback elements and switching circuitry 12 serve to define whether the instrument is being employed as ammeter or a voltmeter. The output voltage of the OP-AMP 10 is supplied to an analog-to-digital converter 14 where the output voltage is converted into a digital representation thereof and transmitted by way of a programmed microprocessor 16 to a suitable display 18. In addition, a keyboard or the like may be provided which transmits information by way of the microprocessor for selecting the operation of the feedback elements and switching circuitry 12 for defining the instrument's operation as, for example, either a voltmeter or an ammeter.

Figure 2:
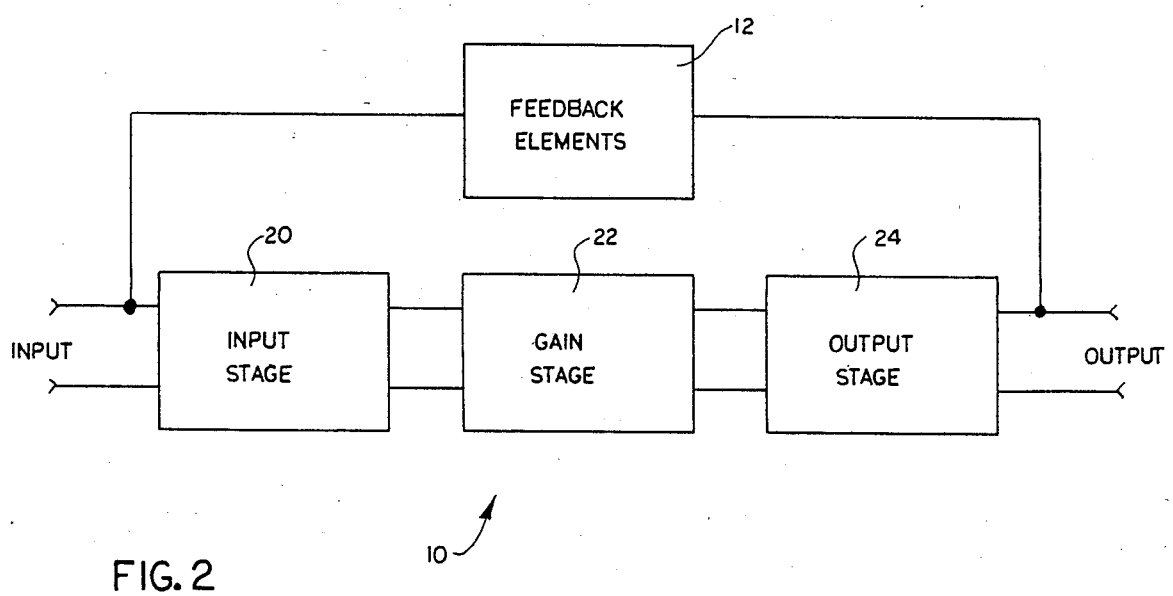
FIG. 2 is a more detailed block diagram of an electrometer operational amplifier employed in the electrometer of FIG. 1.

The electrometer OP-AMP 10, as best shown in FIG. 2, includes an input stage 20, a gain stage 22 and an output stage 24. The input stage is the subject matter herein and takes the form of a high input impedance, low leakage current JFET differential amplifier. The output of this amplifier is then applied to the gain stage 22, which for example, may take the form of an integrated circuit operational amplifier which is chosen so as to have high gain, low noise, low offset drift and an appropriate frequency response characteristic. The output stage 24 provides the necessary voltage and current compliance to execute the various measurement functions of the instrument. It is the input stage that, in large measure, determines the quality of the electrometer and to which the discussion which follows is directed.

Figure 3:
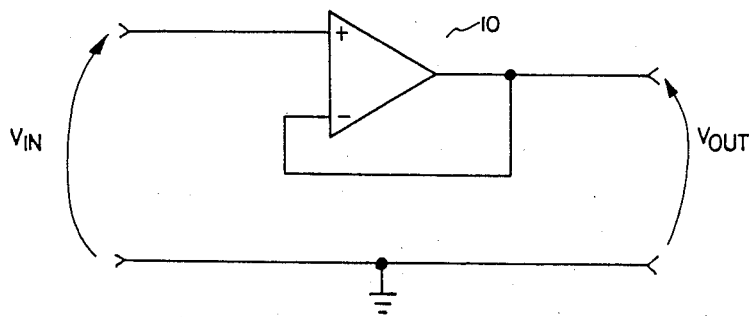
FIG. 3 is a schematic block diagram illustration of an electrometer operational amplifier employed as a voltage measuring circuit.

Considering first the simplified diagram of FIG. 3, there is illustrated an electrometer OP-AMP 10 connected as a voltage measurement circuit wherein the input voltage $V_{in}$ is applied between ground and the positive or noninverting input of the OP-AMP. The output voltage $V_{OUT}$ is proportional to the difference between the inputs so long as the gain is exceedingly high, on the order of 100,000, for example.

Figure 4:
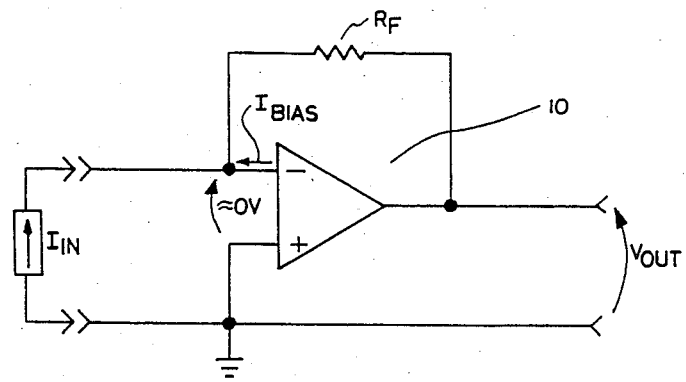
FIG. 4 is a schematic-block diagram illustration of an electrometer operational amplifier serving as a current measuring circuit.

The current measuring version of an electrometer OP-AMP is illustrated in FIG. 4 in which the input current $I_{in}$ is applied to the inverting input of the OP-AMP. The output of the OP-AMP is connected to the inverting input by way of a feedback resistor $R_F$. Note that the noninverting input of the OP-AMP is connected to ground. As seen in FIG. 4, the output voltage $V_{OUT}$ is representative of the current to be measured and has an error dependent upon the magnitude of the input bias current $I_{BIAS}$. Thus, the input bias current sums with the input current $I_{in}$ in the ammeter circuit. Consequently, the bias current $I_{BIAS}$ should be substantially smaller than any current being measured. It is for this reason that the input stage of electrometer greatly affects the quality of operations since any error will be transmitted through the gain stage and the output stage.

Figure 5:
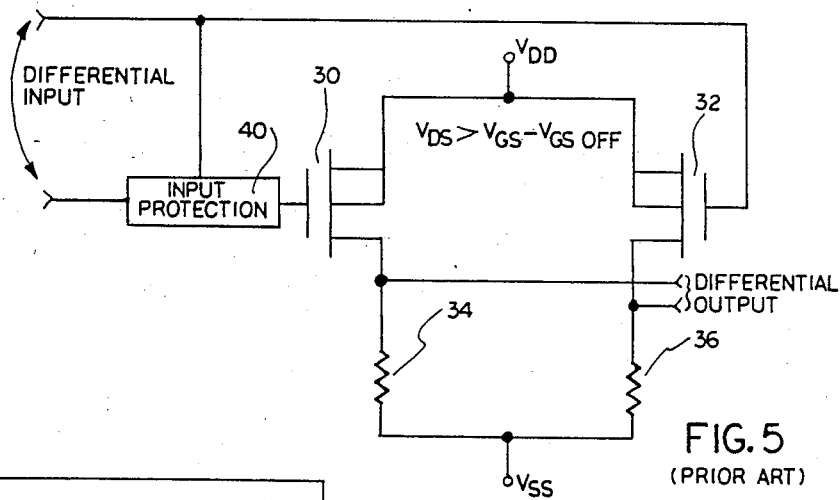
FIG. 5 is a schematic illustration of a prior art MOSFET input stage.

Attention is now directed to FIG. 5 which is illustrative of a typical prior art MOSFET input stage used in electrometer OP-AMPs. This is representative of, for example, the circuit employed in the U.S. Pat. No. 3,654,468, to Shaw, supra. Such a circuit includes a pair of differentially connected MOSFET transistors 30 and 32. These MOSFET transistors are illustrated in general form and may take either P channel or N channel type. In either case, the drains are connected together in common to a drain bias voltage $V_{DD}$. The source electrodes are connected through resistors 34, 36 to a junction point, then to a source voltage $V_{SS}$. The input may be supplied to the gate electrodes and a differential output may be obtained from the source electrodes. Because such a MOSFET differential amplifier is sensitive to overload conditions, an input protection circuit 40 is provided such as that employed in the U.S. Pat. No. 3,654,468, to Shaw, discussed hereinbefore. A MOSFET differential amplifier, such as that illustrated in FIG. 5, provides the desired low input bias current and high input impedance for the input stage of an electrometer OP-AMP. However, the circuit requires input protection circuitry 40 which is elaborate in actual circuit design. This protection circuit can compromise voltage and time response.

In operation, such a MOSFET differential amplifier is operated in what is known as the saturated region of its current-voltage characteristic curve, to be discussed hereinafter. In such case, the drain to source voltage $V_{DS}$ is maintained at a level so that it is always greater than $V_{GS} - V_{GS\ OFF}$ wherein $V_{GS\ OFF}$ is the value of the gate to source voltage at which the drain current is essentially zero as rated by the device manufacturers. This typically may be on the order of 1 to 10 nanoamperes (nA).

Figure 6:
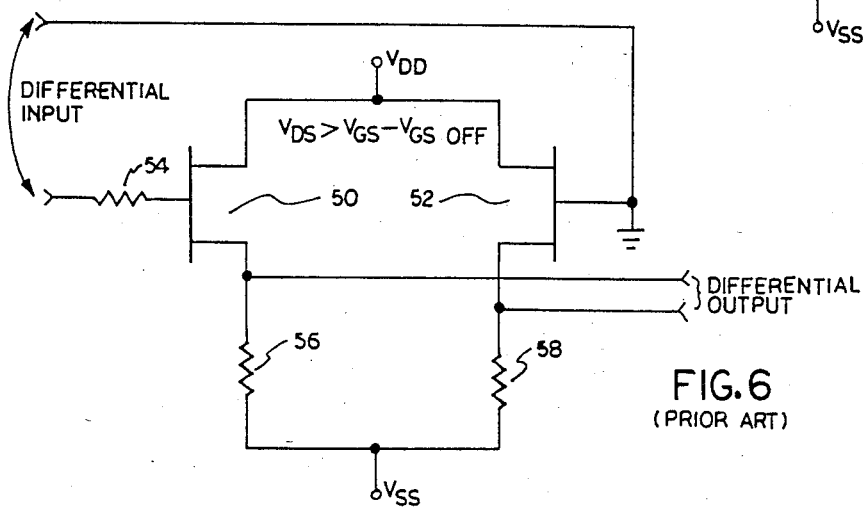
FIG. 6 is a schematic illustration of a prior art JFET source follower input stage.

Reference is now made to FIG. 6 which represents a JFET source follower differential amplifier known in the prior art as an input stage of an electrometer OP-AMP. This may be of either an N type or P type channel and the polarities are not shown in FIG. 6 as either may be applicable. The circuit includes a pair of JFET transistors 50 and 52 having their drain electrodes connected together in common to a drain bias voltage $V_{DD}$. The gate electrodes serve to receive the differential input and a current limiting resistor 54 is placed in the gate circuit of transistor 50 to limit the gate to source current flow during overload. The source electrodes are connected by load resistors 56 and 58 to a junction point connecting with a source voltage $V_{SS}$. The differential output may be obtained from the source electrodes, as shown.

Typically, such a JFET differential amplifier is operated as a source follower since the drain to source voltage $V_{DS}$ is greater than $V_{GS}-V_{GS\ OFF}$. The JFETs act as current sources proportional to the gate to source voltage $V_{GS}$. Thus, when the input gate voltage is varied, the drain currents are unbalanced, and this unbalance is amplified by the source resistors 56, 58 producing a differential output. This JFET differential amplifier provides many improved voltage characteristics over the MOSFET amplifier of FIG. 5 in that the JFET amplifier has improved immunity from damage due to overload or electrostatic discharge, as well as low noise and better offset stability with temperature and time. A disadvantage, however, is the input bias current characteristics with JFETs which usually range much higher than that of MOSFETs, such as on the order of a magnitude of ten times higher input bias currents.

Figure 7:
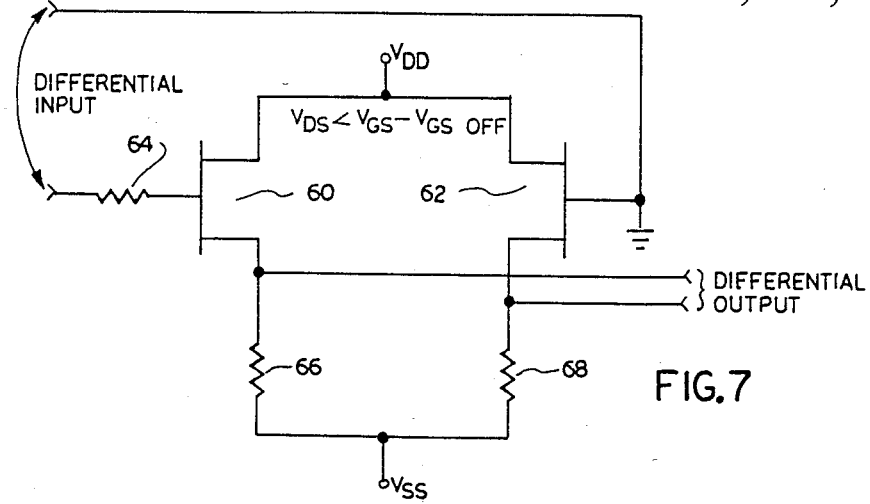
FIG. 7 is a schematic illustration of a JFET ohmic amplifier in accordance with the present invention.

Having now described the prior art implementations of the input stage for an electrometer with reference to FIGS. 5 and 6, attention is directed to the JFET ohmic differential amplifier constructed in accordance with the present invention and illustrated in FIG. 7. The characteristic curve of the drain current with respect to drain to source voltage is illustrated in FIG. 8 and the equivalent circuit of the JFET ohmic differential amplifier is illustrated in FIG. 9.

The JFET ohmic amplifier is structurally similar to that of the JFET source follower amplifier of FIG. 6 with the main distinction being that the drain to source voltage $V_{DS}$ is of a magnitude less than that of voltage $V_{GS}-V_{GS\ OFF}$. The circuit includes a pair of JFET transistors 60 and 62 having their drain electrodes connected together in common to the drain bias voltage $V_{DD}$. The current limiting resistor 64 is connected to the gate electrode of transistor 60 and the differential inputs are supplied to the gate electrodes. The source electrodes are connected by way of load resistors 66 and 68 to a midpoint leading to a source voltage $V_{SS}$.

While the circuits of FIGS. 6 and 7 are structurally similar, it is important to note that in FIG. 7 the drain to source voltage $V_{DS}$ is less than $V_{GS}-V_{GS\ OFF}$. Consequently, the JFETs of FIG. 7 do not behave as current sources proportional to $V_{GS}$ as in the case of FIG. 6, but instead behave as voltage controlled resistors in a bridge configuration such as that of the equivalent circuit in FIG. 9. By lowering the drain to source voltage $V_{DS}$ below that of $V_{GS}-V_{GS\ OFF}$, there results a reduction in the gate-channel leakage which varies with $V_{DG}$ and $V_{GS}$.

Figure 8:
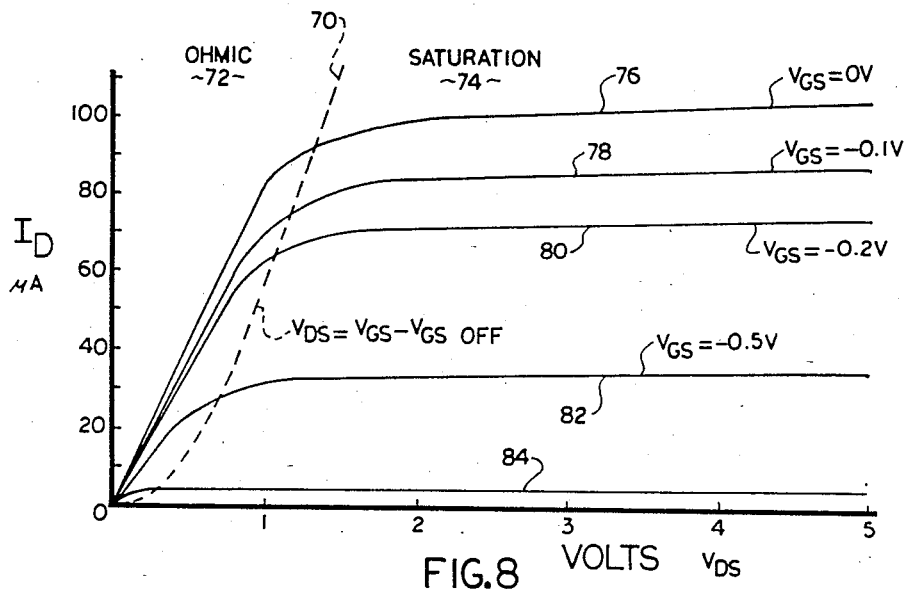
FIG. 8 is a curve illustration of drain current in microamperes (uA) with respect to drain to source voltage in volts and which is useful in describing the invention herein.
Figure 9:
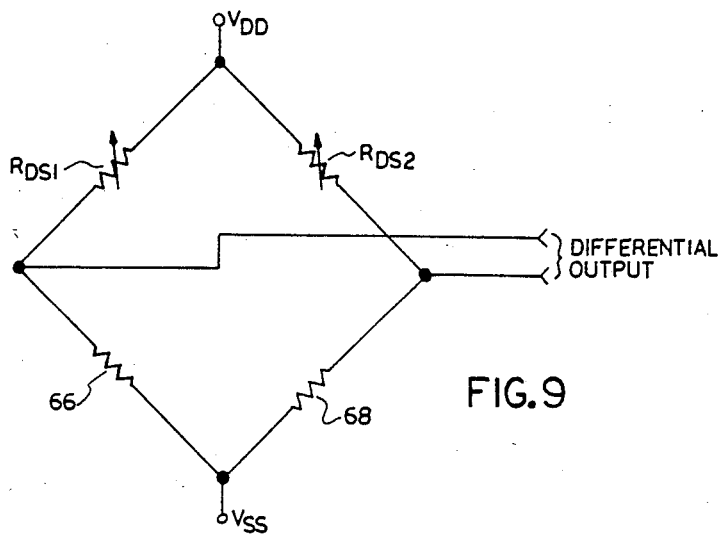
FIG. 9 is a schematic illustration of an equivalent circuit of that in FIG. 7 useful in describing the invention.

Attention is now directed to FIG. 8 which illustrates the operating curve of drain current $I_D$ with respect to the drain to source voltage $V_{DS}$ for various values of the gate to source voltage $V_{GS}$ for a JFET. As shown in FIG. 8, there are two distinctly different regions of operation; namely, an ohmic region and a saturation region which are shown as being divided by a dotted line 70. In this example, the ohmic region 72 is on the left side of the dotted line, and the saturation region 74 is on the right side of the dotted line 70. The characteristic curves include curves 76, 78, 80 and 82 which are illustrated for gate to source voltages $V_{GS}$ of 0 volts, $-0.1$ volts, $-0.2$ volts and $-0.5$ volts, respectively. The dotted line 70 may be defined as:

$$V_{DS}=V_{GS}-V_{GS\ OFF}$$

So long as the drain to source voltage $V_{DS}$ is greater than $V_{GS}-V_{GS\ OFF}$, the transistor behaves as a current source whose value depends on that of $V_{GS}$. This is the normal region of operation for a JFET such as that illustrated in FIG. 6.

Each intersection of the dotted line 70 with one of the curves 76–82 may be considered as the pinch off voltage $V_P$ at that level of gate to source voltage. When $V_{GS}=V_{GS\ OFF}$, the drain current $I_D$ is at its esssentially zero rated level (on the order of 1.0 to 10 nanoamperes). This level of drain current $I_D$ is illustrated by curve 84 for $V_{GS\ OFF}$ having a level on the order of $-1.27$ volts.

When the circuit of FIG. 7 is biased such that drain to source voltage $V_{DS}$ is less than that of $V_{GS}-V_{GS\ OFF}$, the JFET transistors operate in region 72 of the characteristic curve of FIG. 8 and behave as resistors whose value depends on the gate to source voltage $V_{GS}$. The gate to source voltage in FIGS. 7–10 is much less than the absolute value of $V_{GS\ OFF}$. In the equivalent circuit, the JFET channel resistances are shown as variable resistors $R_{DS1}$ and $R_{DS2}$ representing JFET transistors 60 and 62, respectively, operating in the ohmic region 72. Each has a resistance $R_{DS}$ equal to $V_{DS}$ divided by $I_D$. If the input signal $V_{GS}$ is varied, this will cause a variation in the channel resistance $R_{DS}$. It is for this reason the legs of the bridge should be well matched. Thus, resistors 66 and 68 are matched resistors and are used as fixed legs of the bridge and each has a resistance on the order of 20 times that of the JFET channel resistance. Since the JFET may be biased at very low gate to channel voltages, the bridge supplies should be bootstrapped with respect to the gates of the JFETs. As the circuit functions as the input stage of an OP-AMP around which feedback is applied, the two gates which are the inverting and noninverting input terminals will be held at virtually the same voltage. The bridge remains biased at very nearly the same operating point at all times except for an increment of variation in gate voltage necessary to vary the OP-AMP output, usually on the order of hundreds of microvolts or less. From the foregoing equations can be derived to calculate $V_{DS}$ and the gain of the JFETs. These are equations (1) and (2) below.

$$V_{DS} = \frac{I_D}{KI_{DSS}} \frac{(V_{GS\ OFF})^2}{V_{GS\ OFF} - V_{GS}} + I_D R_S \quad (1)$$

where $R_S$=series channel resistance and where K depends upon the specific device used (K is about 1.5) and, $$\text{Gain} = \frac{I_D}{(KI_{DSS})} \frac{(V_{GS\ OFF})^2}{(V_{GS\ OFF} - V_{GS})^2} \quad (2)$$

Equations (1) and (2) are important in practicing the invention for ensuring that the gate-channel junctions remain reverse biased under all operating conditions and for determining the gain of the circuit. The gain determines the degree to which second stage errors contribute to the overall error of the circuit. Knowing how both leakage current improvement and gain degradation will vary with bias points allows one to determine the proper leakage-to-voltage error tradeoff for circuit applications.

Figure 10:
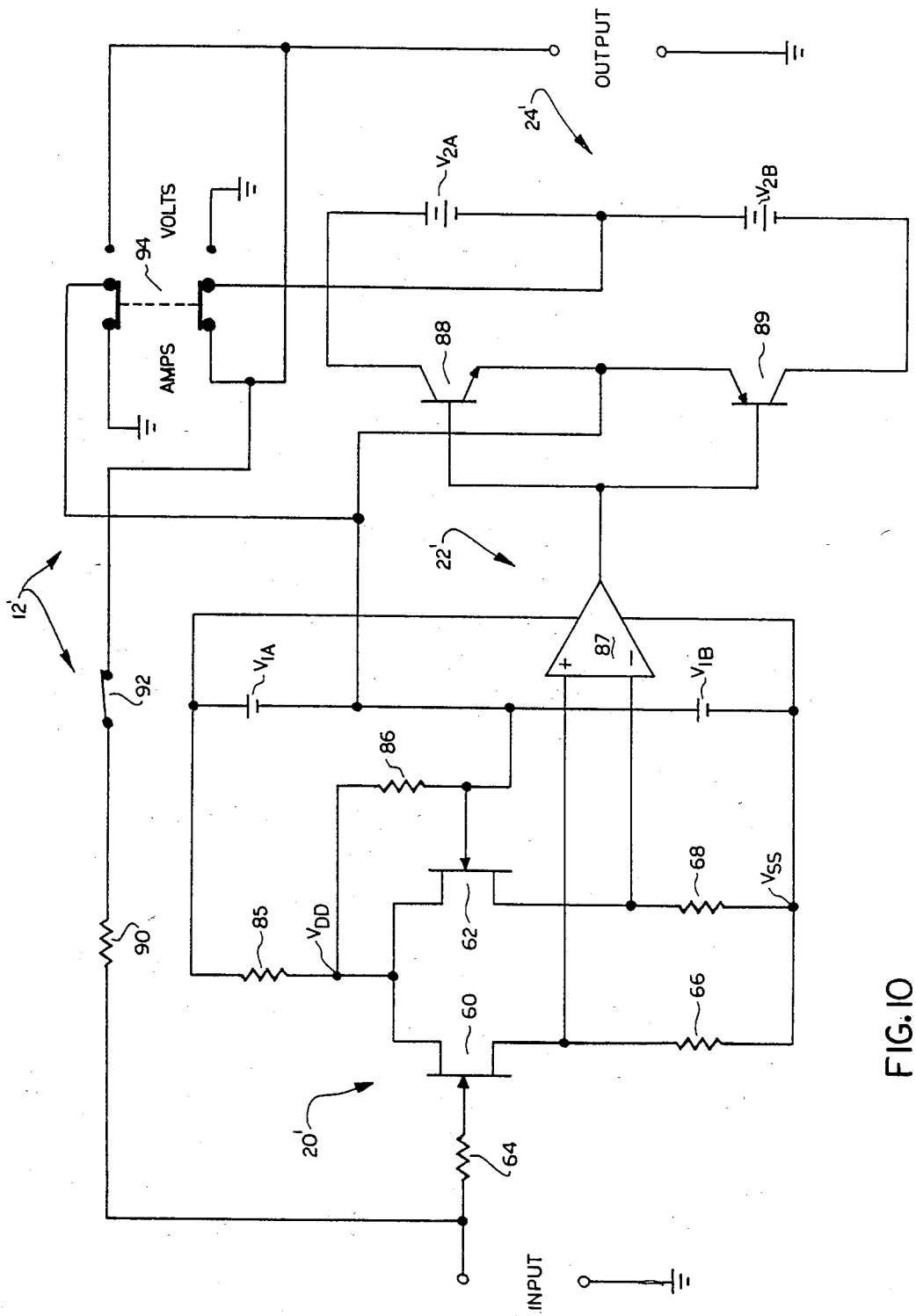
FIG. 10 is a schematic circuit diagram illustrating an electrometer operational amplifier employing the JFET input stage in accordance with the present invention.

A circuit implementation of an electrometer OP-AMP based on the block diagram of FIG. 2 but incorporating the features brought out with respect to FIG. 7 is illustrated in FIG. 10 and includes an input stage 20′, a gain stage 22' and an output stage 24', together with feedback and switching elements 12'. The input stage 20' is patterned after that of FIG. 7 and consequently similar character references are employed for identifying similar components. Thus, the JFET ohmic amplifier includes a pair of JFET transistors 60 and 62 having their drains connected together in common to a drain bias voltage $V_{DD}$. The source electrodes are connected by way of matched load resistors 66 and 68 to a source bias voltage $V_{SS}$. Input protective resistor 64 connects the input to the gate of transistor 60. The bias voltages are obtained from DC voltage sources $V_{1A}$ and $V_{1B}$, each being a five volt bootstrap arranged power supply. The source bias voltage $V_{SS}$ is obtained from the negative side of the DC supply $V_{1B}$ and the drain bias voltage $V_{DD}$ is obtained at the junction of resistors 85 and 86 connected across voltage supply $V_{1A}$. In this arrangement, the resistors are chosen so as to divide the voltage $V_1$ so that the value of $V_{DD}$ is 0.4 volts. The differential output of the JFET differential amplifier is obtained from the source electrodes thereof and supplied to an operational amplifier 87 connected as shown in FIG. 10 and which, in turn, supplies its output as control signals to the base electrodes of NPN transistor 88 and of PNP transistor 89. When the output of the OP-AMP 87 is positive, it drives transistor 88 into conduction. When the output of the OP-AMP 87 is negative, it drives the transistor 89 into conduction. To allow for voltage measurements up to 200 volts, the output stage employs 220 volt DC sources $V_{2A}$ and $V_{2B}$.

The feedback and switching network 12' includes a feedback resistor 90 which is placed in the circuit for current measurement only when the switch 92 is closed, as shown. Also in this condition, a double pole amps-volts switch 94 is in the position as shown in the drawings so that the gate of JFET 62 is connected to ground for measuring current.

In the example of FIG. 10, the source or load resistors 66 and 68 are a matched set of resistors, each having a resistance of 200 K ohms. These set the bias current near the zero drift operating point of $I_D = 25$ microamperes. The drain bias voltage $V_{DD}$ is set at 0.4 volts which guarantees that the source voltage $V_{S1}$ and the source voltage $V_{S2}$ are greater than 100 millivolts to prevent forward biasing of the junctions despite any device variations. This choice of the drain voltage $V_{DD}$ also provides for a minimum gain of 0.24 which determines a maximum drift of 28.4 microvolts per degree centigrade and maximum noise of 9.8 microvolts peak-to-peak from 0.1 to 10 Hz, as well as for providing a leakage reduction of between 3.8 and 14 times that of a JFET source follower, such as that illustrated in FIG. 6. This circuit of FIG. 10, then, achieves an input bias current on the order of $5 \times 10^{-15}$A at 23° C.

Whereas the invention has been described in conjunction with a preferred embodiment, it is to be understood that various modifications may be made without departing from the spirit and scope of the invention as defined by the appended claims.

Having described a preferred embodiment of the invention, the following is claimed:

1. A JFET differential amplifier, comprising:
   first and second JFET transistors having their drain electrodes connected in common,
   first and second resistors respectively connecting the source electrodes of said transistors to a junction point,
   an input circuit connected to said gate electrodes and an output circuit connected to said source electrodes,
   means for applying a DC source bias voltage $V_{SS}$ to said junction point for biasing said source electrodes through said resistors,
   means for applying a DC drain bias voltage $V_{DD}$ to said commonly connected drain electrodes,
   said bias voltage applying means applying voltage of a magnitude selected so that said JFET transistors operate in the ohmic region of their characteristic drain current $I_D$-drain source voltage $V_{DS}$ curve and thereby act as voltage controlled resistors whose resistance varies with the magnitude of the gate to source voltage $V_{GS}$.

2. A JFET differential amplifier as set forth in claim 1 wherein said bias voltage applying means applies bias voltage of a value selected so that each of said JFET transistors operates with its drain to source voltage $V_{DS}$ less than that of voltage $V_{GS}-$VGS OFF, where $V_{GS\ OFF}$ is the gate to source voltage at which a said JFET transistor is rated as having essentially no drain current.

3. A JFET differential amplifier as set forth in claim 2 wherein said first and second resistors have equal resistance values.

4. A JFET differential amplifier as set forth in claim 3, wherein said first and second resistors each has a resistance greater than that of the channel resistances of said first and second transistors, respectively.

5. A JFET differential amplifier as set forth in claim 4, wherein the resistance of each said first and second transistors is on the order of twenty times that of the channel resistance of each of said first and second transistors.

* * * * *